United States Patent [19]

Kim et al.

[11] Patent Number: 5,278,854
[45] Date of Patent: Jan. 11, 1994

[54] SIGNAL AMPLIFICATION USING OPTICALLY ACTIVATED BULK SEMI-INSULATING GAAS

[75] Inventors: Anderson H. Kim, Toms River; Maurice Weiner, Ocean; Robert J. Youmans, Brick; Robert A. Pastore, Jr., Laurence Harbor, all of N.J.

[73] Assignee: The United States of America as represented by the Secretary of the Army, Washington, D.C.

[21] Appl. No.: 946,720

[22] Filed: Sep. 18, 1992

[51] Int. Cl.$^5$ ............................................... H01S 3/00
[52] U.S. Cl. .......................................... 372/38; 372/82; 372/10; 372/69
[58] Field of Search .................. 372/69, 70, 38, 82, 372/10

[56] References Cited

U.S. PATENT DOCUMENTS

| 4,805,072 | 2/1989 | Ackermann et al. | 372/82 |
| 4,890,294 | 12/1989 | Nishimae et al. | 372/82 |
| 4,937,834 | 6/1990 | Egawa | 373/82 |

OTHER PUBLICATIONS

R. Pastore and M. Weiner, "RF Oscillations in Optically Activated Semi-Insulating GaAs" Record of 7th IEEE Pulse Power Conference, Jun. 1989, pp. 872–874.

*Primary Examiner*—Léon Scott, Jr.
*Attorney, Agent, or Firm*—Michael Zelenka; William H. Anderson

[57] ABSTRACT

Bulk gallium arsenide having a high hold-off voltage is optically activated by a laser resulting in high power output. A high voltage input is applied to a semi-insulating gallium arsenide material. The gallium arsenide material is activated by laser light, thereby resulting in large current conduction. An external oscillating signal is superimposed on the high current resulting in a high power output.

11 Claims, 1 Drawing Sheet

SIGNAL AMPLIFICATION USING OPTICALLY ACTIVATED BULK SEMI-INSULATING GAAS

STATEMENT OF GOVERNMENT RIGHTS

The invention described herein may be manufactured, used, and licensed by or for governmental purposes without the payment to us of any royalties thereon.

BACKGROUND OF THE INVENTION

1. Field of the Invention

This invention relates generally to high peak power oscillating signals, and particularly to a high power microwave device.

2. Description of the Prior Art

As electronic devices and microwave devices in particular become more sophisticated, and are applied to more applications, more power is increasingly desired. The Gunn-effect diode is used to produce oscillating signals due to the periodic nucleation and disappearance of traveling space-charge instability domains. The Gunn-effect diode is made of an n-type GaAs, gallium arsenide, material. N-type gallium arsenide material has free electrons ranging from $10^{14}$ to $10^{17}$ per cubic centimeter at room temperature.

Two references that disclose the use of semiconductors to provide an oscillation of current are, J. B. Gunn, "Microwave Oscillation of Current in III-V Semiconductors", Solid State Communications, Vol. 1, pp 88–91, 1963; and R. Pastore and M. Weiner, "RF Oscillation in Optically Activated GaAs", Record of 7th IEEE Pulse Power Conference, Jun. 1989, pp 872–874. In the R. Pastore and M. Weiner article, a cavity is used to couple the gallium arsenide to the cavity fields. Therefore, the frequency is determined by the cavity adjustment, and the device operates as an oscillator.

While these semiconductor devices for producing oscillation of current resulted in devices useful for their intended purpose, they are not suitable for all applications. In the n-type gallium arsenide devices, power is limited by the voltage hold off capabilities of the n-type gallium arsenide. Additionally, n-type gallium arsenide devices have a high dark current due to relatively high concentration of free electrons. When high power is desired, and high input voltage used, high dark currents are induced resulting in undesirable thermal heating effects. The undesirable thermal heating effects will eventually lead to thermal runaway, and a destruction of the device.

Therefore, there is a need for an improved high power device for amplifying a signal.

SUMMARY OF THE INVENTION

The present invention comprises a circuit using a semi-insulating bulk gallium arsenide device that is optically activated to provide a high power output having a pre-selected signal superimposed thereon. The present invention acts as an amplifier. A semi-insulating bulk gallium arsenide device is coupled to a high voltage source. A laser is used to activate the gallium arsenide device generating a high current waveform. A pre-selected externally generated signal is superimposed on the high current waveform.

Accordingly, it is an object of the present invention to provide a device capable of high power output.

It is an advantage of the present invention that the oscillation frequency is determined by an externally generated signal which is easy to control.

It is a feature of the present invention that semi-insulating bulk gallium arsenide is used.

These and other objectives, advantages, and features will become readily apparent in view of the following more detailed description.

DETAIL DESCRIPTION OF THE PREFERRED EMBODIMENT

Figure 1:
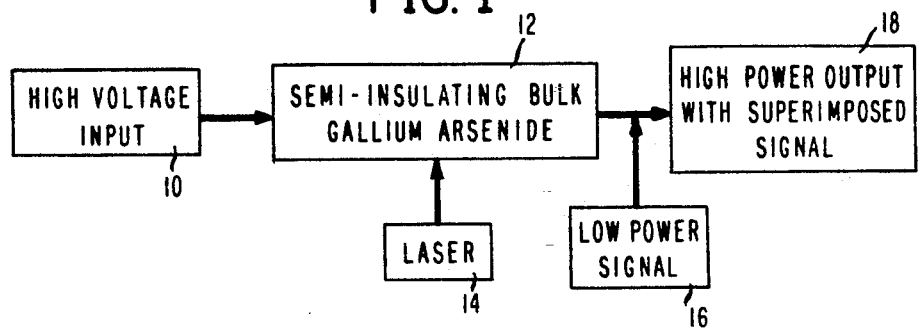
FIG. 1 is a block diagram illustrating the present invention.

FIG. 1 illustrates in block form the present invention. Block 10 represents a high voltage input source. The high voltage input 10 can be a high voltage pulser used to charge the device. This high voltage pulse input is provided by a number of commercially available circuits, such as a "hard tube pulser." The high voltage input 10 is coupled to a semi-insulating bulk gallium arsenide device represented by Block 12. The bulk gallium arsenide device 12 has a high power output represented by Block 18. A laser represented by Block 14 is positioned to illuminate the bulk gallium arsenide represented by Block 12. Block 16 represents a relatively low power signal that is superimposed on the high power output of the bulk gallium arsenide device 12.

In operation, the semi-insulating bulk gallium arsenide material 12 has a high hold-off voltage. The semi-insulating gallium arsenide material has a high resistivity, in the order of $10^7$ ohms per centimeter. This results in very little dark current. This is in contrast to n-type gallium arsenide material that has a resistivity of 1 ohm per centimeter. The resistivity is controlled by the free carrier concentration in the material. Semi-insulating gallium arsenide material has a free carrier concentration in the range of $10^8$ cm$^{-3}$. The free carrier concentration can be controlled during fabrication of the material.

When the semi-insulating bulk gallium arsenide 12 is illuminated by a laser 14, a high density plasma of electron-hole pairs is generated within the bulk gallium arsenide. A Q-switched Nd:YAG laser can be used. The Nd:YAG laser has a wavelength of 1.06 $\mu$m (micrometers). A laser diode can also be used. A suitable laser diode has a wavelength of 908 nm (nanometers). Depending on the thickness of the semi-insulating gallium arsenide material used the laser energy required to will be between 0.1 and 1.0 mJ (millijoules), having a pulse width of approximately 10 ns (nanoseconds) or less. Upon activation of the bulk gallium arsenide 12 by the laser 14, a large current is produced. A low power signal 16 is superimposed onto the large current. For example, the low power signal 16 can be a high frequency microwave signal. The resulting output 18 is of high power with a superimposed signal thereon.

In a test circuit, a bulk semi-insulating gallium arsenide device has been successfully tested with the use of a Q-switched Nd:YAG laser having a light pulse of 10 ns. The 10 ns pulse from the laser activated the gallium arsenide material so as to sustain current conduction for up to 200 ns. This current conduction of 200 ns by the gallium arsenide material for a period greater than the laser light pulse is defined as "Lock-On+. The low power signal is superimposed on the high amplitude current by perturbing the electrical field strength in the active area of the gallium arsenide device, and modulating the uniformly flowing conducting plasma, thereby inducing an oscillation of current on top of the high amplitude conducting current.

Figure 2:
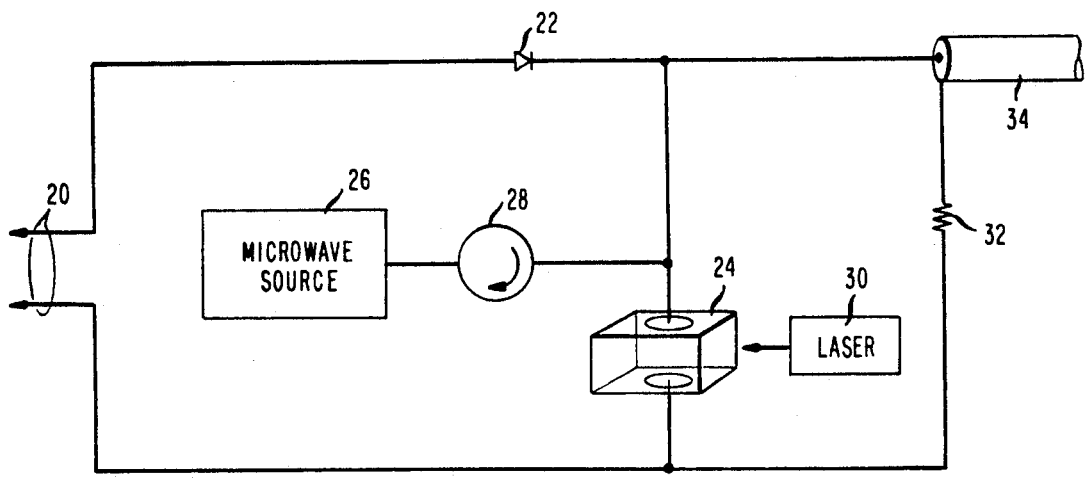
FIG. 2 is a schematic illustrating one embodiment of the present invention.

FIG. 2 is a circuit schematic illustrating the practical application of the present invention. A high voltage pulser input is provided at terminals 20 to the semi-insulating bulk gallium arsenide material 24 through a diode 22. Coupled to the gallium arsenide material 24 is a microwave source 26 and a circulator 28. The output of the gallium arsenide material 24 is coupled to co-axial output cable 34 and resistor 32. The cable 34 acts as an energy storage element and is a Pulse Forming Line (PFL). The length of the PFL cable 34 corresponds to an electrical pulsewidth between 20 and 200 ns. Diode 22 therefore, prevents the PFL cable 34 from discharging toward the charging pulser or high voltage source connected to terminals 20 once the PFL cable 34 is charged. Resistor 32 serves as a matched load impedance to the impedance of the PFL cable 34, which is approximately 50 ohms. Because of the matched impedance most of the discharged energy is transferred to the 50 ohm resistor 32. Laser 30 is positioned to illuminate the gallium arsenide material 24.

In operation, a high voltage is applied across the gallium arsenide device 24 through input terminals 20. With a 5 millimeter gap distance device, a hold-off voltage of over 35 kilovolts has been demonstrated. Therefore, a high conduction current can be achieved. When the device is operated with 35 kilovolts biasing voltage in a 50 ohms load resistance, the amplitude of conduction current is 350 amps.

The external microwave source 26 has a frequency f, and is of relatively low power. The microwave source 26 is provided through a circulator 28, primarily to protect the microwave source 26 from the charging cycle of the high voltage input 20 when a high voltage pulser is used.

Figure 3:
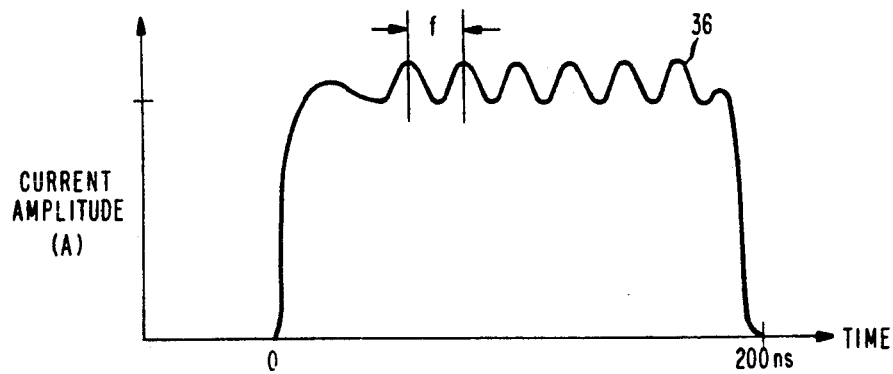
FIG. 3 is a graph illustrating output of the circuit illustrated in FIG. 2.

FIG. 3 illustrates the output waveform from the circuit illustrated in FIG. 2. A high amplitude current is generated for approximately 200 ns having a superimposed waveform 36 thereon. The superimposed waveform has a frequency f, the same as the microwave source 26.

From the above, it should readily be appreciated that the present invention provides a high output power having a superimposed signal thereon. The superimposed signal is very controllable due to the externally generated nature of the signal. The combination of high output power and controllability of the signal has heretofore not been achievable. Therefore, the present invention has many applications in high power devices such as jamming and microwave weapons.

Although the preferred embodiment has been illustrated and described, it will be obvious to those skilled in the art that various modifications may be made without departing from the spirit and scope of this invention.

What is claimed is:

1. A circuit providing high output power comprising:
   a high voltage source;
   a bulk gallium arsenide device conductively coupled to said high voltage source via an input line with a diode disposed along the input line so as to protect the high voltage source from a back charge;
   output terminals conductively coupled to said bulk gallium arsenide device opposite the input line;
   signal waveform source coupled to the input line, said signal waveform source providing a signal to be superimposed over the high voltage;
   a pulse forming line conductively coupled to said signal waveform means and said bulk gallium arsenide device via said input line, a width of said pulse forming line corresponding to a predetermined electrical pulse width; and
   optical activation means optically coupled to said bulk gallium arsenide device; wherein said high voltage source provides a voltage which, when the optical activation means is inactive, charges the pulse forming line and generated a hold-off voltage over the bulk gallium arsenide device and wherein the signal waveform source provides a signal to the input line and through the bulk gallium arsenide device and, concurrently therewith, said optical activation means illuminates the bulk gallium arsenide device such that a conducting plasma is generated by the formation of electron-hole pairs within the bulk gallium arsenide device and application of a pulse from the pulse forming line, thus producing at the output terminal a high amplitude current with the signal superimposed thereon.

2. A circuit as in claim 1 wherein:
   said bulk gallium arsenide device has a resistance greater that $10^7$ ohms per centimeter.

3. A circuit as in claim 1 wherein:
   said signal waveform source generates a microwave signal.

4. A circuit as in claim 1 wherein:
   said activation means is a laser.

5. A circuit as in claim 4 wherein:
   said laser is a Q-switched Nd:YAG laser.

6. A circuit as in claim 5 wherein:
   said Q-switched Nd:YAG laser has a wavelength of 1.06 $\mu$m.

7. A circuit as in claim 4 wherein:
   said laser is a diode laser.

8. A circuit as in claim 7 wherein:
   said diode laser has a wavelength of 908 nm.

9. A circuit as in claim 4 wherein:
   said laser produces a pulse equal to or less than 10 ns.

10. A circuit as in claim 4 wherein: said laser produces a pulse having energy between 0.1 and 1.0 mJ.

11. The circuit of claim 1 further comprising a circulator conductively coupled between the signal waveform source and the bulk gallium arsenide device such that the signal waveform source is protected from the high voltage of said high voltage source.

* * * * *